United States Patent
Luo et al.

(10) Patent No.: US 8,013,633 B2
(45) Date of Patent: Sep. 6, 2011

(54) THIN FILM TRANSISTOR LOGIC

(75) Inventors: Hao Luo, San Jose, CA (US); Ping Mei, Palo Alto, CA (US); Carl P. Taussig, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 139 days.

(21) Appl. No.: 11/821,068

(22) Filed: Jun. 20, 2007

(65) Prior Publication Data

US 2008/0315918 A1    Dec. 25, 2008

(51) Int. Cl.
*H03K 19/0175*    (2006.01)

(52) U.S. Cl. ............... 326/83; 326/86; 326/68; 326/63; 326/81

(58) Field of Classification Search ............. 326/62–63, 326/68, 81–83, 86–87, 95–98, 104–106, 326/108; 345/97–100; 377/78–79; 327/108, 327/109, 333

See application file for complete search history.

(56) References Cited

U.S. PATENT DOCUMENTS

| | | | | |
|---|---|---|---|---|
| 5,426,383 A * | 6/1995 | Kumar | ................. | 326/119 |
| 5,592,108 A * | 1/1997 | Tsukahara | ................. | 326/69 |
| 5,760,621 A * | 6/1998 | Keeth | ................. | 327/112 |
| 5,949,398 A * | 9/1999 | Kim | ................. | 345/100 |
| 5,952,847 A * | 9/1999 | Plants et al. | ................. | 326/80 |
| 6,756,816 B2 * | 6/2004 | Miyake | ................. | 326/83 |
| 6,909,115 B2 * | 6/2005 | Kokubo et al. | ................. | 257/66 |
| 6,975,142 B2 * | 12/2005 | Azami et al. | ................. | 326/88 |
| 7,057,598 B2 * | 6/2006 | Azami et al. | ................. | 345/100 |
| 7,202,863 B2 * | 4/2007 | Kimura et al. | ................. | 345/204 |
| 7,242,220 B2 * | 7/2007 | Lu | ................. | 326/68 |
| 7,570,081 B1 * | 8/2009 | Harris et al. | ................. | 326/121 |
| 2002/0063583 A1 * | 5/2002 | Eaton | ................. | 326/121 |

* cited by examiner

*Primary Examiner* — Shawki S Ismail
*Assistant Examiner* — Christopher Lo

(57) ABSTRACT

A thin-film logic circuit, which can be fabricated entirely of TFTs of the same conductivity type, includes a logic stage connected to a supply voltage and a level shifter connected to a wider voltage range provided by the supply voltage and ground. The logic circuit produces output signals with full rail-to-rail signal range from ground to the supply voltage and can implement or include a basic logic component such as an inverter, a NAND gate, or a NOR gate or more complicated circuits in which many basic logic components are cascaded together. Such logic circuits can be fabricated directly on flexible structures or large areas such as in flat panel displays.

16 Claims, 2 Drawing Sheets

THIN FILM TRANSISTOR LOGIC

BACKGROUND

Thin-film-transistor (TFT) technology is important for fabrication of circuitry that requires the ability to flex and in large area devices such as flat panel displays, imagers, and detectors that require active areas that are large compared to the current size of semiconductor wafers. However, a significant limitation of the TFT technology results from the difficulty in fabricating useful PMOS devices in a-Si Amorphous silicon (a-Si) or other thin film semiconductor materials such as Zinc Oxide and thin-film polysilicon. As a result of this difficulty, many TFT circuits only use NMOS transistors, which can cause problems when trying to implement logic with full rail-to-rail output voltage levels, i.e., signals ranging from ground to the power supply voltage. In particular, TFT logic circuits generally lose signal level from the dynamic voltage range and therefore cannot be easily cascaded in the way that conventional CMOS circuits can.

FIG. 1 shows a circuit diagram for a conventional NMOS inverter 100 that can be fabricated using thin-film transistors in a-Si or other material. Inverter 100 includes two NMOS transistors 110 and 120. Transistor 110 has a gate and a drain connected to supply voltage Vdd and a source connected to an output node 115. Transistor 120 has a drain connected to output node 115, a gate connected to receive an input signal IN, and a source connected to ground.

In operation, when an input signal IN is high, ideally at supply voltage Vdd, transistor 120 carries a saturation current which also flows from supply voltage Vdd through transistor 110. Accordingly, when input signal IN is high, inverter 100 acts as a voltage divider, and output signal OUT is pulled to a voltage that will not be the ground voltage but instead depends on the sizes of transistors 110 and 120. When input signal IN is low (ideally at the ground voltage), transistor 120 will be off, and transistor 110 will pull up output node 115 to a voltage that is lower than supply voltage Vdd by at least the threshold voltage of transistor 110. Accordingly, the output signal OUT from inverter 100 does not have the full rail-to-rail voltage range from ground to supply voltage Vdd.

The problem of being unable to provide output signals with the full rail-to-rail voltage swings limits the number of such logic gates that may be serially connected or cascaded without additional signal correction or conditioning. Accordingly, systems and methods that are able to provide rail-to-rail signal range in TFT circuits and NMOS circuits are desired.

SUMMARY

In accordance with an aspect of the invention, a logic circuit includes a logic stage connected to a supply voltage and a level shifter connected to a voltage higher than the supply voltage. In one embodiment, the level shifter includes: a first NMOS transistor having a gate and drain connected to the higher voltage and a source connected to a first node; and a second NMOS transistor connected between the first node and a reference voltage and having a gate to which a first input signal of the logic circuit is applied. The logic stage includes: a third NMOS transistor coupled between the supply voltage and a second node and having a gate connected to the first node; and a fourth NMOS transistor coupled between the second node and the reference voltage and having a gate to which the first input signal of the logic circuit is applied. An output signal of the logic circuit that is provided at the second node has full rail-to-rail voltage swings.

BRIEF DESCRIPTION OF THE DRAWINGS

Use of the same reference symbols in different figures indicates similar or identical items.

DETAILED DESCRIPTION

In accordance with an aspect of the present invention, dual rail logic using a supply voltage and a higher voltage can provide full rail-to-rail (e.g., the supply voltage to a reference voltage or ground) swings and maintain the constant levels when required. The dual rail a-Si logic can be used to build in basic logic circuit blocks such as inverters, NAND gates, and NOR gates and therefore can construct virtually all the logic circuits commonly built using CMOS technology. One particular application of the invention is in a flat panel display where the NMOS a-Si logic described herein can be used to build edge electronics to drive the gate lines. In contrast, a conventional manufacturing process fabricates edge electronics for flat panel displays in silicon chips that must be attached to the panels.

Figure 1:
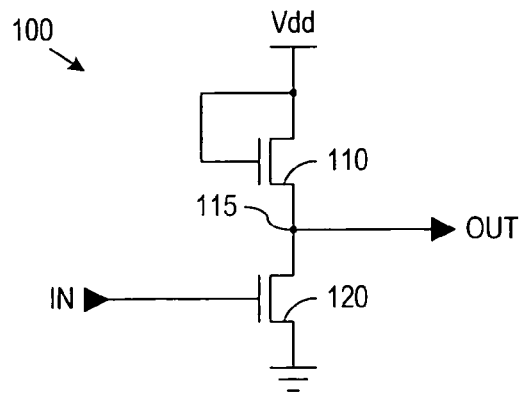
FIG. 1 is a circuit diagram of a conventional NMOS inverter.
Figure 2:
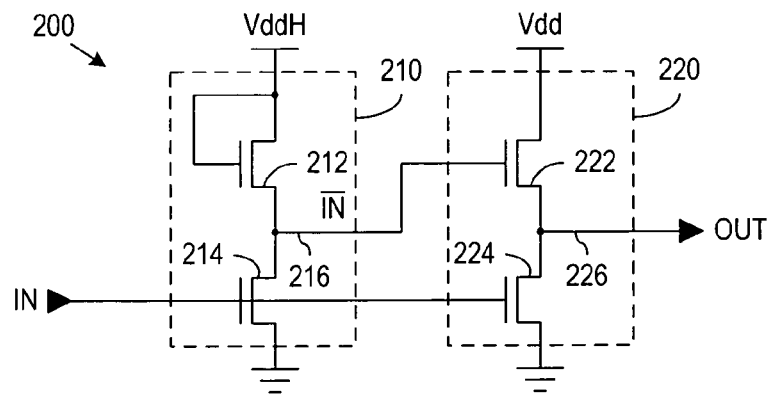
FIG. 2 is a circuit diagram of an inverter in accordance with an embodiment of the invention.

FIG. 2 illustrates an inverter 200 in accordance with an embodiment of the invention employing a level shifter 210 and an inverting stage 220. Level shifter 210 operates at a voltage VddH that is higher than the supply voltage Vdd of inverter 200, but level shifter 210 is otherwise similar to the conventional NMOS inverter of FIG. 1. In particular, level shifter 210 includes a loading TFT 212 and a driving TFT 214 connected in series between voltage VddH and ground. Both TFTs 212 and 214 are N-type. Loading TFT 212 has a gate and a drain coupled to higher voltage VddH and a source coupled to an internal node 216. Driving TFT 214 has a drain connected to node 216, a source connected to ground, and a gate connected to the input signal IN.

Inverting stage 220 includes a loading TFT 222 and a driving TFT 224 connected in series between supply voltage Vdd and ground. Both TFTs 222 and 224 are N-type. Loading TFT 222 has a drain connected to power supply Vdd, a source connected to an output node 226, and a gate driven by level shifter 210. Driving TFT 224 has a drain connected to output node 226, a source connected to ground, and a gate connected to receive an input signal IN.

When the input signal IN is low, preferably near ground voltage, driving TFT 214 in level shifter 210 is non-conductive, and loading TFT 212 pulls node 216, and therefore an internal signal $\overline{IN}$ applied to the gate of TFT 222, up to a voltage that is lower than voltage VddH by the threshold voltage Vt of TFT 212. In accordance with an aspect of the invention, voltage VddH is selected to be higher than supply voltage Vdd by at least the sum of the threshold voltages of TFTs 212 and 222, e.g., VddH≧Vdd+2Vt if TFTs 212 and 222 have the same threshold voltage Vt. As a result, the voltage of internal signal IN is greater than supply voltage Vdd by at least the threshold voltage Vt of TFT 222. TFT 222 can then pull the output signal OUT to supply voltage Vdd because the gate-to-source $V_{GS}$ of TFT 222 is greater than or equal to the threshold voltage Vt of TFT 222 even when the source (output node 226) of TFT 222 is at supply voltage Vdd. Also, input signal IN being low makes TFT 224 non-conductive, so that TFT 224 does not prevent TFT 222 from pulling output signal OUT to voltage Vdd. Inverter 200 thus inverts the low input signal IN to produce output signal OUT fully at supply voltage level Vdd.

When input signal IN is high, preferably near supply voltage Vdd, driving TFT 214 in level shifter 210 is conductive. The sizes of TFTs 212 and 214 in level shifter 210 are selected so that TFT 214 pulls internal signal IN, which is applied to the gate of loading TFT 222 in inverting stage 220, low enough that TFT 222 is in non-conductive. The high input signal IN also puts driving transistor 224 in inverting stage 220 in the conductive mode, and with loading TFT 222 being non-conductive, driving TFT 224 pulls output signal OUT to the ground voltage. Inverter 200 thus inverts the high input signal IN to produce output signal OUT fully at ground voltage.

The level of output signal OUT of inverter 200 can thus change from ground to supply voltage Vdd when input signal IN changes from supply voltage Vdd to ground. Inverter 200 thus has rail-to-rail output capability, and one or more additional inverters of the same type as inverter 200 can be cascaded with inverter 200 without worrying about a signal losing dynamic range. Additionally, all of TFTs 222, 224, 212, and 214 are NMOS devices that can be fabricated in a-Si or other thin-film semiconductors using processes well known in the art.

Figure 3:
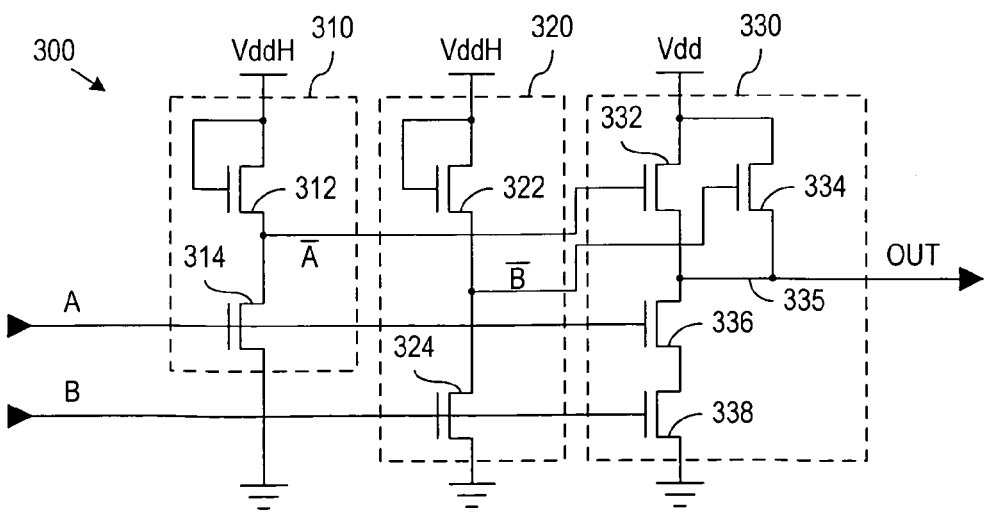
FIG. 3 is a circuit diagram of a NAND gate in accordance with an embodiment of the invention.

Other logic gates such as NAND gates and NOR gates can be built in thin films using similar techniques. FIG. 3, for example, shows a NAND gate 300 in accordance with an embodiment of the invention. NAND gate 300 includes two level shifters 310 and 320 and a logic stage 330. The level shifters 310 and 320 receive the input signals A and B of NAND gate 300, and logic stage 330 produces the output signal OUT.

Level shifter 310, which operates at higher voltage VddH, receives input signal A and produces an internal signal $\overline{A}$ that is applied to the gate of a TFT 332 in logic stage 330. Level shifter 310 includes a loading TFT 312 and a driving TFT 314 that are connected in the same manner as TFTs in level shifter 210 of FIG. 2. In the same manner as the operation of level shifter 210 described above in regard to FIG. 2, internal signal $\overline{A}$ from level shifter is in a high state or a voltage about VddH−Vt when input signal A is low and is in a low state or a voltage that keeps a connected transistor 332 non-conductive when input signal A is high.

Level shifter 320, which operates at higher voltage VddH, similarly includes a loading TFT 322 and a driving TFT 324 that are connected in the same manner as the TFTs in level shifter 210 of FIG. 2. TFT 324 receives input signal B and produces an internal signal $\overline{B}$. In the same manner as described above, internal signal $\overline{B}$ from level shifter 320 is in a high state or a voltage of about VddH−Vt when input signal B is low and is in a low state or a voltage that keeps a connected transistor 334 non-conductive when input signal B is high.

Logic stage 330 includes the pair of TFTs 332 and 334 connected in parallel between supply voltage Vdd and an output node 335 and a pair of TFTs 336 and 338 that are connected in series between output node 335 and ground. TFTs 332 and 334 have gates connected to respectively receive internal signals $\overline{A}$ and $\overline{B}$ from respective level shifters 310 and 320. Input signals A and B are respectively applied to the gates of TFTs 336 and 338.

In operation, when at least one of input signals A and B is low, at least one of transistors 336 and 338 is non-conductive, and at least one of internal signals $\overline{A}$ and $\overline{B}$ is in a high state, i.e., at least voltage VddH−Vt. Voltage VddH is greater than supply voltage Vdd by at least 2Vt, so that at least one of TFTs 332 and 334 is conductive and able to pull output signal OUT fully to supply voltage Vdd. Accordingly, if either or both of input signals A and B are in the low state, output signal OUT of NAND gate 300 is a high state that is fully up to supply voltage Vdd.

When both input signals A and B are high (preferably near supply voltage Vdd), internal signals $\overline{A}$ and $\overline{B}$ are both in a sufficiently low state that both TFTs 332 and 334 are non-conductive. The high input signals A and B also make both TFTs 336 and 338 conductive, so that the series connected TFTs 336 and 338 pull output signal OUT fully to ground. Accordingly, when both input signals A and B are high, NAND gate 300 drives output signal OUT to a low state that is fully ground. NAND gate 300 thus provides the desired logical operation and a full rail-to-rail voltage swing.

Figure 4:
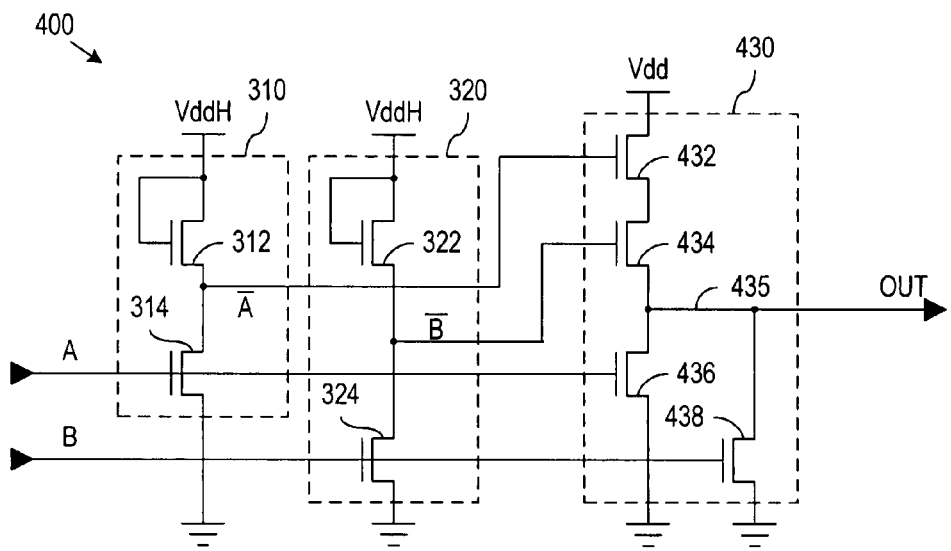
FIG. 4 is a circuit diagram of a NOR gate in accordance with an embodiment of the invention.

FIG. 4 shows a NOR gate 400 in accordance with an embodiment of the invention. NOR gate 400 includes level shifters 310 and 320 that are connected to receive input signals A and B and that generate respective internal signals $\overline{A}$ and $\overline{B}$ as described above in regard to FIG. 3. NOR gate 400 also includes a logic stage 430 including TFTs 432, 434, 436, and 438. TFTs 432 and 434 are connected in series between supply voltage Vdd and an output node 435. Internal signals $\overline{A}$ and $\overline{B}$ from level shifters 310 and 320 are respectively applied to the gates of TFTs 432 and 434. TFTs 436 and 438 are connected in parallel between output node 435 and ground, and input signals A and B are respectively applied to the gates of TFTs 436 and 438.

When at least one of the input signals A and B applied to NOR gate 400 is high, at least one of transistors 436 and 438 is conductive, and at least one of internal signals $\overline{A}$ and $\overline{B}$ is in a low state, i.e., a voltage such that the corresponding TFT 432 or 434 is non-conductive. As a result, no current flows from supply voltage through transistors 432 and 434 to node 435, and one or both of transistors 436 and 438 are conductive and pull the output signal OUT on output node 435 to ground. Accordingly, if either or both of input signals A and B are in the high state, output signal OUT of NOR gate 300 in is a low state that is fully at the ground or reference voltage.

When both input signals A and B are low (preferably near ground), both transistors 436 and 438 are non-conductive. Internal signals $\overline{A}$ and $\overline{B}$ are both in a high state, i.e., at least voltage Vdd+Vt, so that series connected TFTs 432 and 434 pull the output signal on node 435 up to supply voltage Vdd. Accordingly, when both input signals A and B are low, NOR gate 400 drives output signal OUT to a high state that is fully the supply voltage Vdd. NOR gate 400 thus provides the desired logical operation and a full rail-to-rail voltage swing.

The embodiments of this invention described above enable rail-to-rail output capability in a TFT circuit containing only NMOS transistors fabricated in a-Si or other thin film semiconductor materials such as Zinc Oxide and polysilicon. As a result, TFT logic can cascade many functional blocks to produce more complicated functions. In contrast, fabrication of such complex circuits with other thin-film technologies that suffer from loss of dynamic signal range would be difficult or impossible. The TFT circuitry can further include charge pumps or other circuits to generate the higher voltage VddH from the supply voltage Vdd, so that the existence or use of voltage VddH is transparent or unknown to the user of the TFT circuit.

Figure 5:
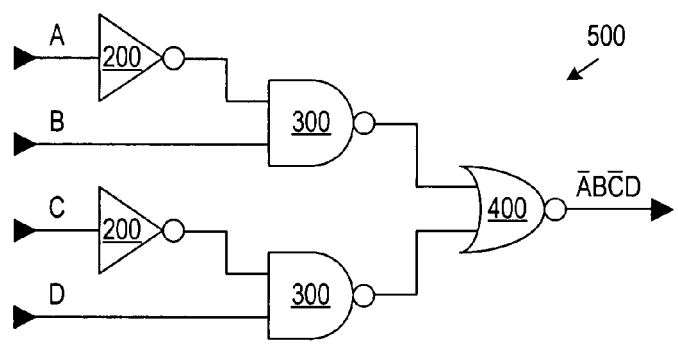
FIG. 5 illustrates a branch of a decoder circuit that can be constructed using inverters, NAND gates, and NOR gates in accordance with embodiments of the invention.

One example of complex logic that can be fabricated using the logic gates described above is a decoder circuit. FIG. 5 shows the example of one branch 500 of a 4-bit decoder. Decoder branch 500 includes a NOR gate 400 having input terminals connected to the output terminals of two NAND gates 300, and each NAND gate 300 has an inverter 200 connected to one of its input terminals. The logic gates in decoder branch 500 are thus cascaded in three levels. With the illustrated connections, decoder branch 500 asserts and output signal $\overline{A}B\overline{C}D$ high only when the four input signals A, B, C, and D meet the conditions of signal A being low, signal B being high, signal C being low, and signal D being high, e.g., when the input signals represent the 4-bit binary value 0101. Techniques for combining inverters, NAND gates, and NOR gates to design decoder branches decoding other binary value are well known in the art and generally require more levels of logic gates when the number of input bits increases. For complex decoders, more levels of logic gates would be a problem if each level lost more of the dynamic signal range. Since each of gates 200, 300, and 400 has rail-to-rail output capability the gates can be easily cascaded as needed and complex logic such as decoder circuits can be implemented.

Figure 6:
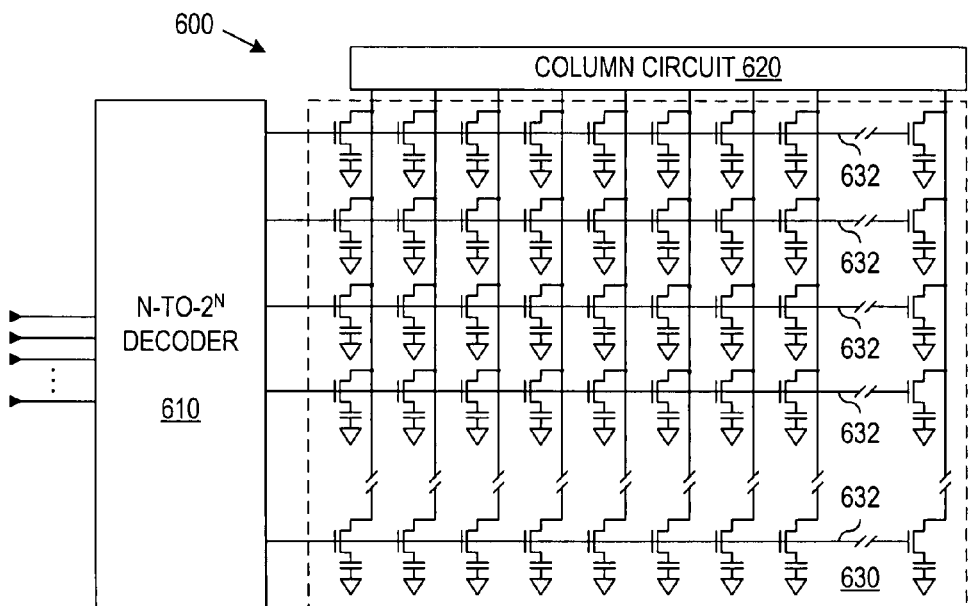
FIG. 6 illustrates a circuit in accordance with an embodiment of the invention integrating decoder circuits and a TFT array in the same thin film.

TFT decoders can be used in large TFT array applications, such as flat panel displays. FIG. 6, for example, illustrates a thin-film circuit 600 including row decoder logic 610, column logic 620, and a TFT array 630 that can all be fabricated using techniques described herein in a thin film of a flat panel display. With a conventional architecture, array 630 has gate lines 632 that need to be driven to high one by one sequentially, for example, to refresh of pixels in the flat panel display. Row decoder 610, which is constructed from inverters 200, NAND gates 300, and NOR gates 400 of the types described above, can perform this function and provides full rail-to-rail signal range even though decoder 610 includes only NMOS transistors. In contrast, some current systems require silicon chips to be bonded on the edge of a panel to provide address decoding for a TFT array fabricated on the panel. The embodiment of this invention illustrated in FIG. 6 can integrate decoder 610 and column logic 620 directly on the panel edge using the same TFT fabrication process as used for array 630.

Although the invention has been described with reference to particular embodiments, the description is only an example of the invention's application and should not be taken as a limitation. For example, although the above described embodiments of the invention use only NMOS transistors in a thin-film where useful PMOS transistors are difficult fabricate, some alternative embodiments of the invention use only PMOS transistors in a thin film such as some organic semiconductors where NMOS devices are difficult to fabricate. A purely PMOS embodiment, for example, can include a logic stage made solely of PMOS transistors and PMOS level shifters that are driven by the supply voltage and a negative voltage. The level shifters in the PMOS implementation apply gate voltages to PMOS pull-down TFT in the logic stage, so that the gate voltages are either sufficiently positive to make the PMOS transistors non-conductive or negative enough that PMOS pull-down TFTs can pull an output signal to ground giving the logic stage a full rail-to-rail dynamic signal range for the output signal or signals. Various other adaptations and combinations of the features of the embodiments disclosed are within the scope of the invention as defined by the following claims.

What is claimed is:

1. A logic circuit comprising:
   a first level shifter comprising:
   a first NMOS transistor having a gate and drain coupled to a first supply voltage and a source coupled to a first node; and
   a second NMOS transistor coupled between the first node and a ground and having a gate to which a first input signal of the logic circuit is applied, the first supply voltage being higher than a high state of the first input signal and higher than a high state of an output signal from the logic circuit;
   a logic stage comprising:
   a third NMOS transistor coupled between a second supply voltage and a second node and having a gate coupled to the first node; and
   a fourth NMOS transistor coupled between the second node and the ground and having a gate to which the first input signal of the logic circuit is applied, wherein the output signal of the logic circuit is provided at the second node and the high state of the output signal corresponds to the second supply voltage; and
   a second level shifter comprising:
   a fifth NMOS transistor having a gate and a drain coupled to the first supply voltage and a source coupled to a third node; and
   a sixth NMOS transistor coupled between the third node and the ground and having a gate to which a second input signal of the logic circuit is applied, wherein
   the logic stage further comprises:
   a seventh NMOS transistor coupled between the second supply voltage and the second node and having a gate coupled to the third node; and
   an eighth NMOS transistor coupled between the second node and the ground and having a gate to which the second input signal of the logic circuit is applied.

2. The circuit of claim 1, wherein the first, second, third, and fourth transistors are thin-film transistors.

3. The circuit of claim 2, wherein the thin-film transistors are fabricated in one of amorphous silicon, Zinc Oxide, and polysilicon.

4. The circuit of claim 1, wherein the third and seventh NMOS transistors are connected in parallel, and the fourth and eight transistors are connected in series.

5. The circuit of claim 4, wherein the logic circuit comprises a NAND gate, and the first, second, third, fourth, fifth, sixth, seventh, and eighth NMOS transistors are the only transistors in the NAND gate.

6. The circuit of claim 1, wherein the third and seventh NMOS transistors are connected in series, and the fourth and eight transistors are connected in parallel.

7. The circuit of claim 6, wherein the logic circuit comprises a NOR gate, and the first, second, third, fourth, fifth, sixth, seventh, and eighth NMOS transistors are the only transistors in the NOR gate.

8. The circuit of claim 1, wherein the logic circuit is part of a decoder for a TFT array and is fabricated in a thin film with the TFT array.

9. The circuit of claim 8, wherein the thin film comprises a material from a group consisting of amorphous silicon, Zinc Oxide, and polysilicon.

10. A logic circuit comprising:
    a first set of NMOS transistors coupled between a first supply voltage and an output node at which an output signal of the logic circuit is produced;
    a set of level shifters coupled to a second supply voltage that is higher than the first supply voltage and coupled to receive respective input signals of the logic circuit, wherein each of the level shifters generates an internal signal that is applied to a gate of a corresponding one of the NMOS transistors in the first set, each of the internal signals has a high state that corresponds to the second supply voltage, and the second supply voltage is higher than a high state voltage of the input signals and higher than a high state voltage of the output signal; and a second set of NMOS transistors coupled between the output node and ground and having gates coupled to respectively receive the input signals, wherein each of the level shifters comprises:

a first NMOS transistor having a gate and drain coupled to the second supply voltage and a source coupled to a first node; and a second NMOS transistor coupled between the first node and a ground and having a gate to which a first input signal of the logic circuit is applied.

11. The circuit of claim 10, wherein the first and second NMOS transistors and the NMOS transistors in the first and second sets are thin-film transistors.

12. The circuit of claim 11, wherein the thin-film transistors are fabricated in fabricated in one of amorphous silicon, Zinc Oxide, and polysilicon.

13. A logic circuit comprising:

a first set of NMOS transistors coupled between a first supply voltage and an output node at which an output signal of the logic circuit is produced;

a set of level shifters coupled to a second supply voltage that is higher than the first supply voltage and coupled to receive respective input signals of the logic circuit, wherein each of the level shifters generates an internal signal that is applied to a gate of a corresponding one of the NMOS transistors in the first set, each of the internal signals has a high state that corresponds to the second supply voltage, and the second supply voltage is higher than a high state voltage of the input signals and higher than a high state voltage of the output signal; and a second set of NMOS transistors coupled between the output node and ground and having gates coupled to respectively receive the input signals, wherein the logic circuit is part of a decoder for a TFT array and is fabricated in a thin film with the TFT array.

14. The circuit of claim 13, wherein the thin film comprises a material from a group consisting of amorphous silicon, Zinc Oxide, and polysilicon.

15. A logic circuit comprising:

a first level shifter connected to operate using a first supply voltage, receive a first input signal representing a first binary value, and produce at a first node a first internal signal representing the first binary value, wherein a high state of the first input signal is at a level of a second supply voltage and a high state of the first internal signal is at a level of the first supply voltage, the level of the first supply voltage being higher than the level of the second supply voltage;

a second level shifter connected to operate using the first supply voltage, receive a second input signal representing a second binary value, and produce at a second node a second internal signal representing the second binary value, wherein a high state of the second input signal is at the level of the second supply voltage and a high state of the second internal signal is at the level of the first supply voltage; and a logic stage connected to the first node, the second node, and the second supply voltage, wherein the logic stage produces an output signal representing a binary value that depends on the first and second binary values, the output signal having a high state at the level of the second supply voltage, wherein the first level shifter comprises:

a first NMOS transistor having a gate and drain coupled to a first supply voltage and a source coupled to the first node; and a second NMOS transistor coupled between the first node and a ground and having a gate to which a first input signal is applied.

16. The logic circuit of claim 15, wherein the logic stage comprising:

a third NMOS transistor coupled between the second supply voltage and the second node and having a gate coupled to the first node; and a fourth NMOS transistor coupled between the second node and the ground and having a gate to which the first input signal of the logic circuit is applied.

* * * * *

UNITED STATES PATENT AND TRADEMARK OFFICE
CERTIFICATE OF CORRECTION

PATENT NO. : 8,013,633 B2
APPLICATION NO. : 11/821068
DATED : September 6, 2011
INVENTOR(S) : Hao Luo et al.

It is certified that error appears in the above-identified patent and that said Letters Patent is hereby corrected as shown below:

In column 7, line 23, in Claim 12, after "in" delete "fabricated in".

Signed and Sealed this
Fifteenth Day of May, 2012

David J. Kappos
*Director of the United States Patent and Trademark Office*